US00RE38250E

(19) United States
(12) Reissued Patent
Slemmer

(10) Patent Number: US RE38,250 E
(45) Date of Reissued Patent: Sep. 16, 2003

(54) BANDGAP REFERENCE CIRCUIT

(75) Inventor: William Carl Slemmer, Prosper, TX (US)

(73) Assignee: STMicroelectronics, Inc., Carrollton, TX (US)

(21) Appl. No.: 09/684,192

(22) Filed: Oct. 6, 2000

Related U.S. Patent Documents

Reissue of:
(64) Patent No.: 5,818,292
Issued: Oct. 6, 1998
Appl. No.: 08/859,305
Filed: Apr. 2, 1996

U.S. Applications:

(63) Continuation of application No. 08/235,362, filed on Apr. 29, 1994, now abandoned.

(51) Int. Cl.[7] ..... G05F 3/26
(52) U.S. Cl. ..... 327/539; 327/541; 327/542; 323/313; 323/315
(58) Field of Search ..... 327/538, 539, 327/540, 541, 542, 543; 323/313, 315

(56) References Cited

U.S. PATENT DOCUMENTS 4,447,784 A * 5/1984 Dobkin ..... 323/313
4,792,750 A * 12/1988 Yan ..... 323/315
4,839,535 A * 6/1989 Miller ..... 323/314
4,897,595 A * 1/1990 Holle ..... 323/313
4,935,690 A * 6/1990 Yan ..... 323/314
5,029,295 A * 7/1991 Bennett et al. ..... 323/313
5,120,994 A * 6/1992 Joly ..... 323/313
5,304,918 A * 4/1994 Khieu ..... 323/315
5,307,007 A * 4/1994 Wu et al. ..... 323/313
5,619,163 A * 4/1997 Koo ..... 327/539
5,726,563 A * 3/1998 Bolton, Jr. ..... 323/315
6,128,172 A * 10/2000 Feldtkeller ..... 327/512
6,271,715 B1 * 8/2001 Pinchback et al. ..... 327/539

OTHER PUBLICATIONS

Letham et al., A High–Performance CMOS 70–MHz Palette/DAC, IEEE Journal of Solid–State Circuits, vol. SC–22, No. 6, Dec. 1987, pp. 1041–1047.*

* cited by examiner

*Primary Examiner*—Timothy P. Callahan
*Assistant Examiner*—Terry L. Englund
(74) *Attorney, Agent, or Firm*—Lisa K. Jorgenson; Michelle R. Larson

(57) ABSTRACT

According to the present invention, a circuit, utilizing a minimum number of bipolar devices and current mirror scaling devices, generates a bandgap reference voltage. The bandgap voltage generated by the bandgap reference circuit is a function of a plurality of sized current mirror devices, the ratio of a first resistor to a second resistor, and the number and relative sizing of bipolar junction transistors used. The bandgap reference circuit generates a bandgap reference voltage which is suitable for use in a variety of integrated circuit devices, such as a zero power static random access memory (SRAM). If used in a zero power SRAM application, the bandgap reference voltage may be utilized to determine when the primary power source of the zero power SRAM has fallen below a predetermined voltage level and a secondary power source must be substituted for the primary power source.

20 Claims, 4 Drawing Sheets

FIG. 2
(AMENDED)
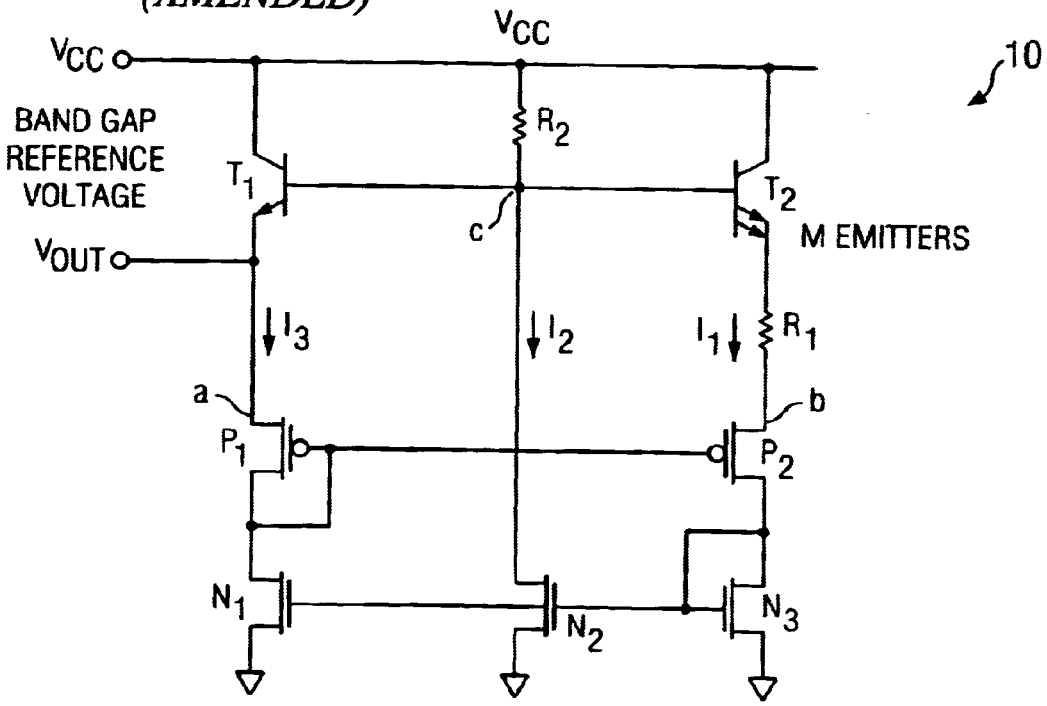

FIG. 4a
(AMENDED)
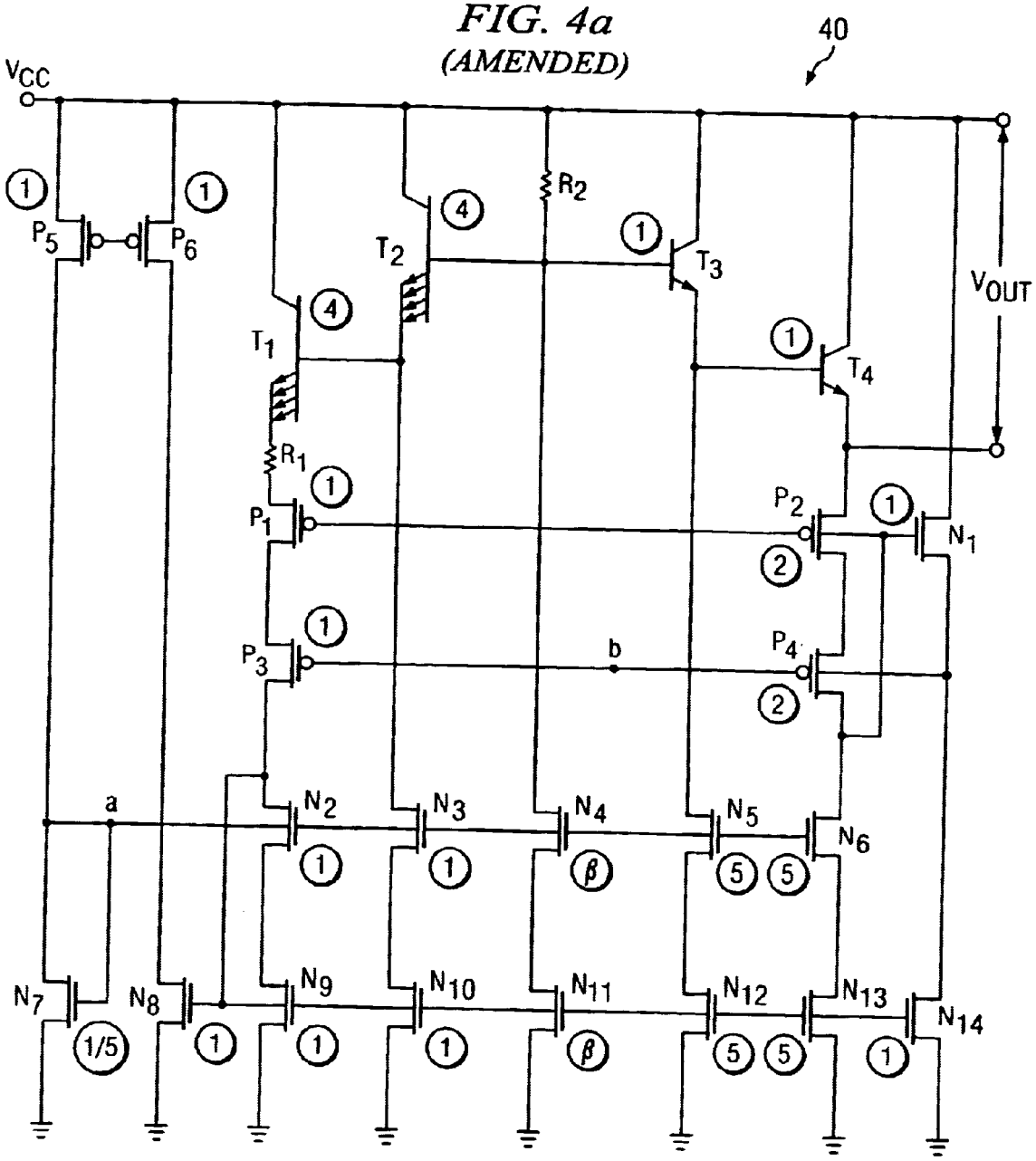

FIG. 5
(AMENDED)
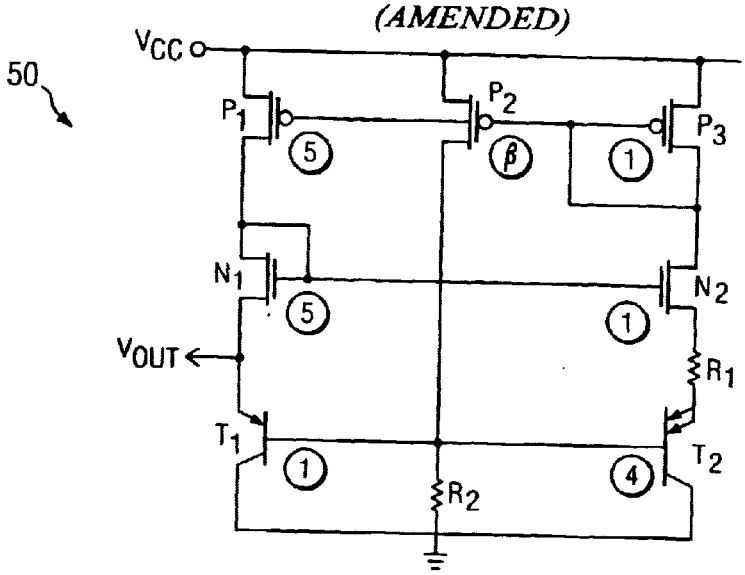
FIG. 6
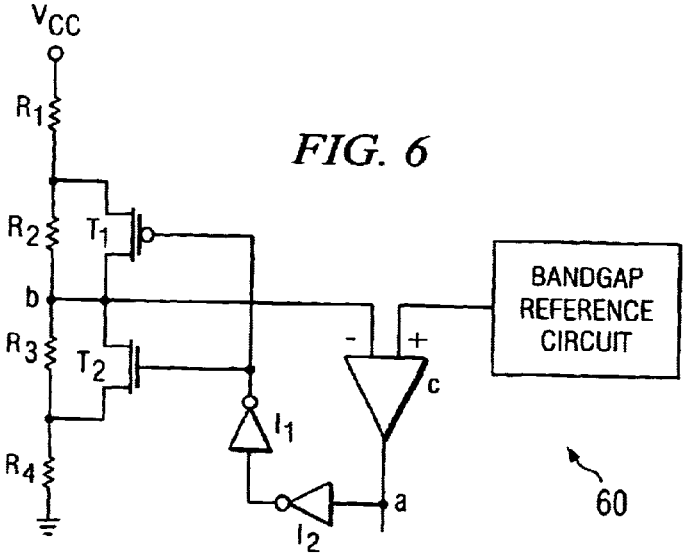
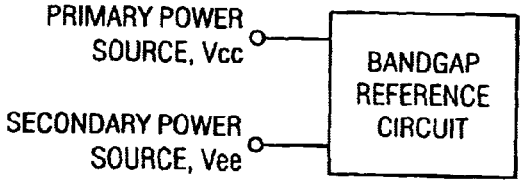
FIG. 7

BANDGAP REFERENCE CIRCUIT

Matter enclosed in heavy brackets [ ] appears in the original patent but forms no part of this reissue specification; matter printed in italics indicates the additions made by reissue.

This is a Continuation, of application Ser. No.: 08/235,362, filed Apr. 29, 1994 now abandoned.

BACKGROUND OF THE INVENTION

The present invention relates generally to integrated circuits, and more specifically to a MOS bandgap reference circuit.

Bandgap reference circuits are used in a variety of integrated circuit devices as a means for sensing changes in the voltage or current level of a device, so that appropriate changes in the operation of the integrated circuit device may be made. In many memory integrated circuit devices, it is desirable to ensure that data stored in the memory is retained and not lost or corrupted upon a loss of power to the device. For example, static random access (SRAM) memory devices referred to as "zero power" devices must be able to sense and respond to changes in the supply voltage. In a zero power SRAM, the data content of the SRAM is protected when the power supply voltage supplied to the SRAM drops below some predetermined voltage level. Typically, the data content of the zero power SRAM is protected by switching from a primary power source to a secondary power source when the power supply voltage to the zero power SRAM falls below the predetermined voltage level.

In order to switch from the primary power source to a secondary power source, it is necessary to be able to sense the voltage level of the primary power source and automatically switch to the secondary power source when appropriate. A bandgap reference circuit is one effective means to determine when it is necessary to switch from the primary power source to the secondary power source of a zero power SRAM. U.S. Pat. No. 4,451,742 issued May 29, 1984 to Aswell describes switching from a primary to a secondary power source and is herein incorporated by reference. However, typical bandgap reference circuits require a large number of bipolar devices which of course consume a large portion of the integrated circuit area of the SRAM. Therefore, because bandgap reference circuits may be effectively used in a zero power SRAM to determine the switching point, it would be desirable to be able to use an improved bandgap reference circuit which has fewer bipolar devices and thus consumes less area and power than bandgap reference circuits currently available.

SUMMARY OF THE INVENTION

It would be advantageous in the art to utilize a bandgap reference circuit which has fewer bipolar junction transistors than the prior art bandgap reference circuit.

It would further be advantageous to the art to utilize a bandgap reference circuit which provides scaling of current through bipolar junction transistors.

Therefore, according to the present invention, a bandgap reference circuit which utilizes a minimum number of bipolar devices and current mirror scaling devices generates a bangap reference voltage. The bandgap voltage generated by the bandgap reference circuit is a function of a plurality of sized current mirror devices, the ratio of a first resistor to a second resistor, and the number and relative sizing of bipolar junction transistors used. The bandgap reference circuit generates a bandgap reference voltage which is suitable for use in a variety of integrated circuit devices, such as a zero power static random access memory (SRAM). If used in a zero power SRAM application, the bandgap reference voltage may be utilized to determine when the primary power source of the zero power SRAM has fallen below a predetermined voltage level and a secondary power source must be substituted for the primary power source.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2 is a schematic diagram of a bandgap reference circuit, using p-well technology, according to a first preferred embodiment of the present invention;

FIG. 4a is a schematic diagram of a cascode connected transistor bandgap reference circuit, using p-well technology, according to a fourth preferred embodiment of the present invention;

FIG. 5 is a schematic diagram of a bandgap reference circuit which may be used to achieve a lower trip point, according to the present invention;

FIG. 6 is a schematic diagram of a circuit which could be used to add hysteresis to the bandgap reference circuit, according to the present invention; and FIG. 7 is a schematic diagram of a secondary power supply which may be used to power the bandgap reference circuits of FIGS. 2, 3, 4, 4a and 5 when the primary source of these bandgap reference circuits has fallen below a predetermined voltage level.

DESCRIPTION OF THE INVENTION

Figure 1:
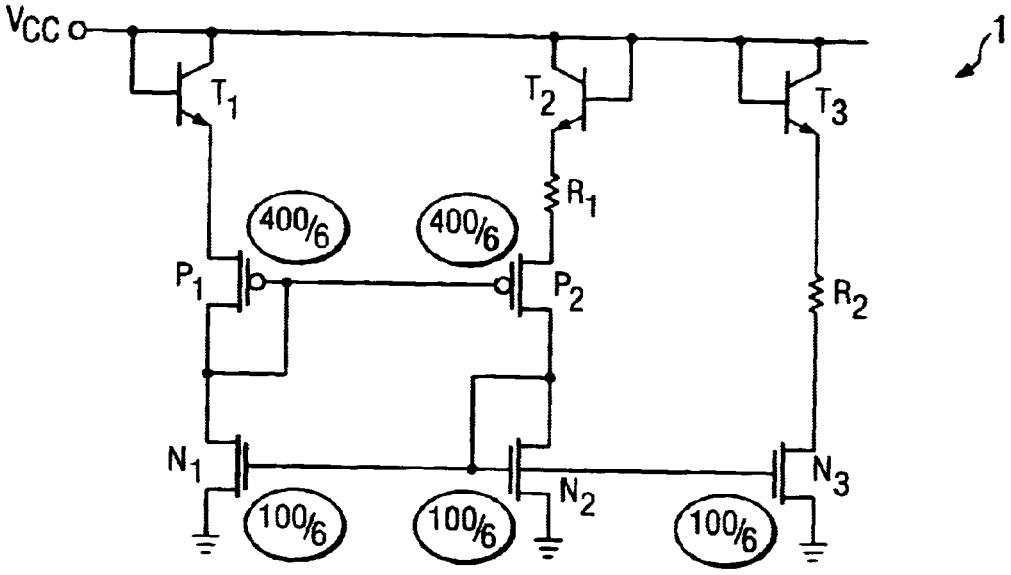
FIG. 1 (PRIOR ART)
FIG. 1 is a schematic diagram of a bandgap reference circuit, according to the prior art.

Referring to FIG. 1, a schematic diagram of a bandgap reference circuit 1, according to the prior art is shown. Bandgap reference circuit 1 has three bipolar current legs and is comprised of bipolar junction transistors T1, T2, and T3, p-channel transistors P1 and P2, n-channel transistors N1, N2 and N3, and resistors R1 and R2. P-channel transistors P1 and P2, and N-channel transistors N1, N2, and N3 are sized transistors and are selected such that P-channel transistors P1 and P2 have a size ratio of 4:1 to N-channel transistors N1, N2, and N3. This sizing is reflected in FIG. 1 by the encircled numbers by the transistors.

The current mirror devices N1, N2, and N3 in each of the three bipolar current legs are each set to the same current. Therefore, the current densities of bipolar junction transistors T1 and T3 are approximately ten times that of bipolar junction transistor 72, since the area of bipolar junction transistor T2 is ten times that of T1 and T3, to produce a in(10) multiplier on the transistor voltage Vt across resistor R1. Additionally, with the same current in each bipolar current leg, the length of resistor R2 must be longer than the length of resistor R1, by a factor of approximately ten times.

The resistance of resistors R1 and R2 is a function of their lengths, as is known in the art.

The present invention employs a improved bandgap reference circuit which generates an actual band gap reference voltage which may be used by zero power circuitry, such as resistive divider and a comparator, to determine the trip point by matching a fraction of VCC to the bandgap reference voltage. The improved bandgap reference circuit of the present invention offers several advantages over the prior art bandgap reference circuit, including a reduced number of bipolar junction transistors and thus a reduced number of bipolar current legs, and scaled current through the bipolar junction transistors through the use of current mirror devices.

FIG. 2 shows a schematic diagram of a bandgap reference circuit, using p-well technology, according to a first preferred embodiment of the present invention. Bandgap reference circuit 10 is a simple form of a bandgap reference circuit, according to the present invention, having only two bipolar current legs, and is comprised of bipolar junction transistors T1 and T2, p-channel transistors P1 and P2, n-channel transistors N1, N2, and N3, and resistors R1 and R2. The number of bipolar current legs of FIG. 2 over FIG. 1 is reduced by connecting resistor R2 to the bases of bipolar junction transistors T1 and T2.

Bipolar junction transistors T1 and T2 provide Vbe voltage drops at different current densities and as indicated by FIG. 2; bipolar junction transistor T2 has M emitters whereas bipolar transistor T1 has a single emitter. P-channel transistors P1 and P2 have the same current density and the same source voltages as node a and node b. Therefore, the bipolar current density voltage, v, which appears across resistor R1 is equal to equation 1 which provides:

$$v = \frac{kT}{q}\ \ln\frac{I3}{I1/M} = \frac{kT}{q}\ \ln\frac{MI3}{I1} \tag{1}$$

where k is Boltzman's constant, T is the temperature in degrees Kelvin, q is the electronic charge, [13] *I3* is the current through p-channel transistor P1, [11] *I1* is the current through resistor R1, and M is the number of emitters of bipolar junction transistor T2. N-channel transistors N1, N2, and N3 function as current mirrors that help set the current ratios of I2 and I3 to I1. Therefore, if n-channel transistor N1 has a width w1, n-channel transistor N2 has a width w2, and n-channel transistor N3 has a width w3, then current I2 and current I3 are defined as shown below in equations 2 and 3:

$$t2 = \frac{W2}{W3}t1 \tag{2}$$

$$t3 = \frac{W1}{W3}t1 \tag{3}$$

Thus the current I1 through resistor R1 is equal to:

$$t1 = \frac{v}{R1} = \frac{kT}{qR1}\ \ln\frac{M3}{t1} = \frac{kT}{qR1}\ \ln\frac{MW1}{W3} \tag{4}$$

The voltage at node c is equal to VCC-[1]*I*2R2, which when referenced to positive voltage supply VCC is equal to:

$$t2R2 = \frac{W2}{W3}\ \frac{kT}{q}\ \frac{R2}{R1}\ \ln\frac{MW1}{W3} \tag{5}$$

Referenced to VCC, the bandgap reference voltage equation is then:

$$Vout = Vt = \frac{W2}{W3}\ \frac{kT}{q}\ \frac{R2}{R1}\ \ln\frac{MW1}{W3} \tag{6}$$

Typical values used for the widths w1, w2, and w3, M, R1, and R2 are such that:

$$\frac{MW3}{W3} = 20 \text{ and } \frac{W2}{W3}\ \frac{R2}{R1} = 8 \tag{7}$$

Given these typical values, bandgap reference circuit 10 generates a voltage below VCC of about 1.3 volts.

As is evident from the above equation and FIG. 2, the present invention offers several important advantages over the prior art bandgap reference circuit 1 of FIG. 1. The current through bipolar junction transistors T1 and T2 is scaled using current mirror devices n-channel transistors N1, N2, and N3, such that a desired current density ratio may be achieved with a lower bipolar junction transistor ratio than was possible with the prior art bandgap reference circuit 1 of FIG. 1. An additional advantage is that the scaled current I2 through resistor R2 permits resistor R2 to be a lower resistor value.

Figure 3:
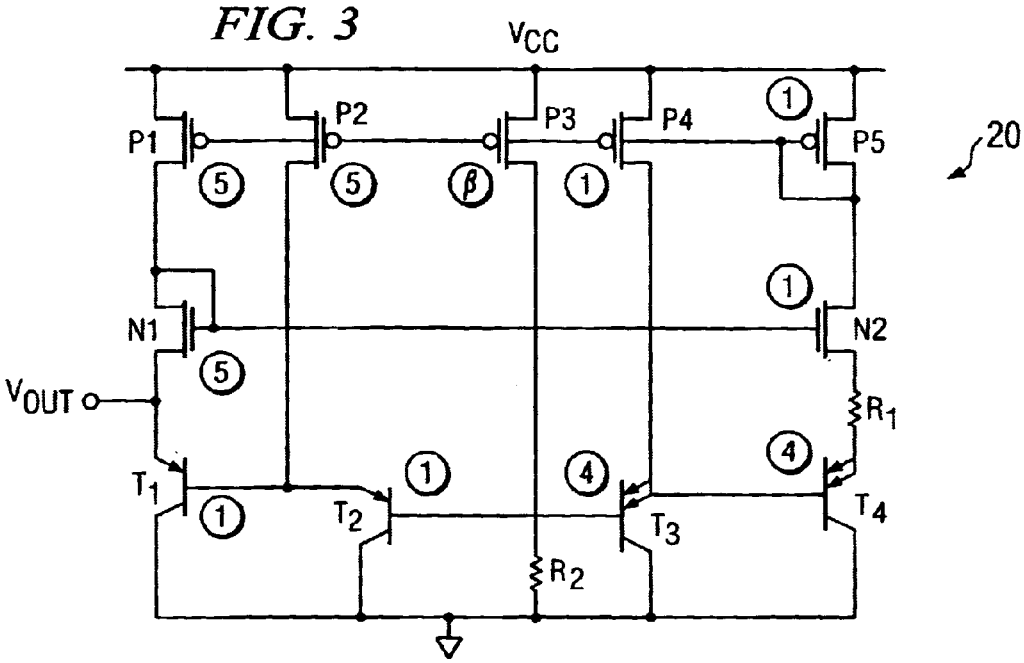
FIG. 3 is a schematic diagram of a bandgap reference circuit, using n-well technology, according to a second preferred embodiment of the present invention.

FIG. 3 is a schematic diagram of a bandgap reference circuit, using n-well technology, according to a second preferred embodiment of the present invention. Referring to FIG. 3, bandgap reference circuit 20 generates a voltage above [VCC] *Vss* of about 2.6 volts, roughly double the magnitude generated by FIG. 2, because 2 bipolar junction transistors rather than one bipolar junction transistor are used in each bipolar current leg. ["]As discussed above, the p-well bandgap reference circuit 10 of FIG. 2 generates a voltage below Vcc of approximately 1.3 volts. Since the n-well bandgap reference circuit 20 of FIG. 3 uses two rather than one bipolar junction transistor, a voltage equal to approximately 2.6 volts above Vss, rather than approximately 1.3 volts below Vcc, is generated by bandgap reference circuit 20["].

Bandgap reference circuit 20 is comprised of p-channel transistors P1, P2, P3, P4, and P5 which act as current mirrors, n-channel transistors N1 and N2, source follower bipolar junction transistors T1, T2, T3, and T4, and resistors R1 and R2. Bipolar junction transistors T1, T2, T3, and T4 are sized transistors and are selected such that bipolar junction transistors T1 and T2 have a size ratio of 1:4 with respect to bipolar junction transistors T3 and T4. The sizing is reflected in FIG. 3 by the encircled 1's and 4's. Similarly, p-channel transistors are sized transistors and are selected such that p-channel transistors P4 and P5 have a size ratio of 1:5 with respect to p-channel transistors P1 and P2. Thus, for bandgap reference circuitry 20, the current density ratio is 20:1. ["]P-channel transistor P3 is a sized transistor having a size denoted by β, as shown in FIG. 3.["]

Therefore, based on the sized transistors, VOUT is defined as follows:

$$VOUT = 2Vbe + \frac{R2}{R1} \ln(20) \frac{kT}{q} \quad (8)$$

A typical value of VOUT is approximately 2.5. Bandgap reference circuit 20 may be made to have better operating characteristics by adding cascode transistors and thereby increase the output impedances of the MOS devices of bandgap reference circuit 20. Such cascode transistors would improve the match between the source follower transistors T1, T2, T3, and T4 and the p-channel transistors which acts as current mirrors.

Figure 4:
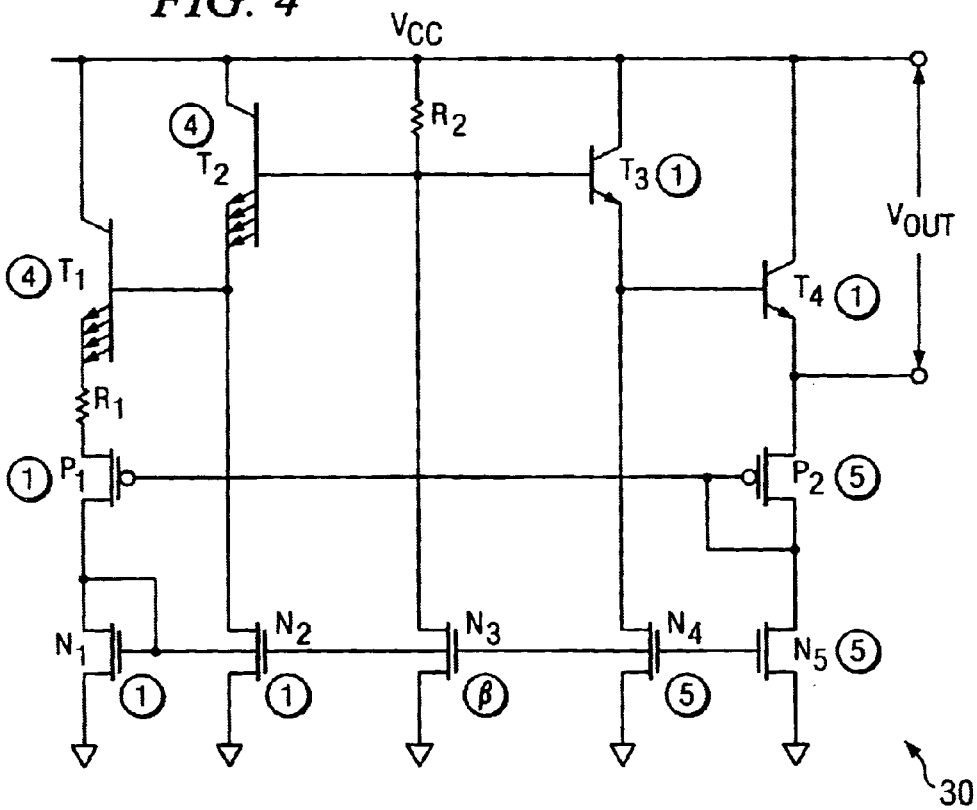
FIG. 4 is a schematic diagram of a bandgap reference circuit, using p-well technology, according to a third preferred embodiment of the present invention.

Referring to FIG. 4, a schematic diagram of a bandgap reference circuit, using p-well technology, according to a third preferred embodiment of the present invention is shown. Bandgap reference circuitry 30 comprises bipolar junction transistors T1, T2, T3, and T4, p-channel transistors P1 and P2, n-channel transistors N1, N2, N3, N4, and N5, and resistors R1 and R2. Bandgap reference circuitry 30 is analogous to circuitry 20 of FIG. 3, except that bandgap reference circuitry 30 is applicable to p-well technology rather than n-well technology. Here, current source n-channel transistors N1, N2, N3, N4, and N5 are still ratioed 1:5 as shown, but are connected to VSS or ground voltage potential. Likewise, bipolar junction transistors T1, T2, T3, and T4 are sized such that the ratio of 1:4 is maintained. Current source n-channel transistor N3 is a sized transistor having a size denoted by β, as shown in FIG. 4. The equation for VOUT is analogous to equation (8), except that VOUT is referenced to VCC rather than VSS. If higher drain impedance is desired to provide the current matching required, cascode current mirror circuit, well known in the art, may be added to FIG. 4.

If higher drain impedance is required to provide the current matching required, a bandgap reference circuit having cascode current mirror circuitry may be used. Referring to FIG. 4*a*, a schematic diagram of a cascode connected transistor bandgap reference circuit 40, using p-well technology, according to a fourth preferred embodiment of the present invention. Cascode connected transistor bandgap reference circuit 40 achieves a similar function to the circuitry of FIG. 4, but with greater accuracy.

Cascode connected transistor bandgap reference circuit 40 is comprised of bipolar junction transistors T1, T2, T3, and T4, p-channel transistors P1, P2, P3, P4, P5, and P6, n-channel transistors N1, N2, N3, N4, N5, N6, N7, N8, N9, N10, N11, N12, N13 and N14, and resistors R1 and R2. The transistors of FIG. 4*a* are sized as indicated by the [encircle] *encircled* numbers. For instance n-channel transistors N4 and N11 are sized transistors having a size denoted by β, as shown in FIG. 4*a*. As in FIG. 4, FIG. 4*a* utilizes p-well technology.

Added cascode current mirror transistors N2, N3, N4, N5, and N6 provide better current matching capabilities while cascode source-follower transistors P3, P4 provide better voltage matching capabilities than the configuration shown in FIG. 4. The bias level at point a may be set to keep the cascode current mirror transistors N2, N3, N4, N5, and N6, and current mirror transistors N9, N10, N11, N12, and N13 in saturation. Similarly, the bias level at point b may be set to keep cascode source-follower transistors P3 and P4, as well as source-follower transistors P1 and P2, in saturation. A start-up circuit may be required to establish initial current flow at start-up.

The functionality of the bandgap reference circuits shown in FIGS. 3, 4 and 4*a* will be adversely impacted as the supply voltage of the circuits is reduced. For example, Vout for the bandgap reference circuit 20 of FIG. 3 is approximately 2.5 volts. For operation of the circuit up to 4.5 volts, the Vout to Vcc difference is 2 volts, which permits an ample voltage range for the n-channel source follower above Vout. Since this n-channel source follower in bandgap reference circuit 20 or its p-channel equivalent in circuit 30 of FIG. 4 will always be in the bulk, rather than a well, it will have a 2.5 volt back gate bias. Thus, the transistor voltage Vt will be approximately 1.1 volts to 1.5 volts, thereby providing adequate voltage for the current sources to operate.

If, however, a lower trip point, such as 4.0 volts, is desired, with operation of the bandgap reference circuit down to 3.5 volts to 3.7 volts, there would not be adequate voltage. Referring to FIG. 5, a schematic diagram of a bandgap reference circuit 50 which may be used to achieve a lower trip point is shown. Bandgap reference circuit 50 is comprises of p-channel transistors P1, P2, and P3, n-channel transistors N1 and N2, bipolar junction transistors T1 and T2, and resistors R1 and R2. The transistors are sized as indicated by the encircled numerals in FIG. 5, such that p-channel transistors P1 and P3 have a size ratio of 5:1; and bipolar junction transistors T1 and T2 have a size ratio of 1:4. ["]P-channel transistor P2 is a sized transistor having a size denoted by β, as shown in FIG. 5.["]

The Vout level would be approximately 1.25 volts and the Vt of the transistors would range from 0.9 volts to 1.2 volts. Thus, a supply voltage of Vcc =3.5 volts, the operating voltage for the current source transistors would be equal to 1.05 volts (3.5 volts −1.25 volts −1.2 volts). Thus, the bandgap reference circuit 50 of FIG. 5 may be used to obtain a considerably lower trip point.

Additionally, the bandgap reference circuits described above may be enhanced by adding hysteresis capability. Referring to FIG. 6, a schematic diagram of a circuit 60 which could be used to add hysteresis to a bandgap reference circuit is shown. Circuit 60 is comprised of resistors R1, R2, R3, and R4, transistors T1 and T2, inverters I1 and I2, comparator C, and the Bandgap Reference Circuit shown in the block. Hysteresis can be added by bypassing resistance in the resistor divider with a MOS switch which is controlled by a signal derived from the comparator output C. A positive state at node a indicated that node b is below the trip point. Transistor T2 is turned on and transistor T1 is turned off in order to move node b, thereby producing hysteresis.

In FIGS. 2, 3, 4, 4*a* and 5, the operation of the bandgap reference circuit is a function of the ratio of resistors R1 and R2, and the ratios of the current mirror and source follower portions of the circuit—not the precise values given resistors R1 and R2. Thus, by carefully choosing the resistor and transistor ratios, a bandgap reference circuit may be realized using few bipolar transistors.

The bandgap reference voltage generated by the present invention will typically be used to determine if the bandgap reference voltage is below a predetermined voltage level. If it is below the predetermined voltage level, then a high gain comparator will flip at the predetermined trip point causing the zero power SRAM to be powered by a secondary power source rather than a primary power source. Referring to FIG. 7, a secondary power source which may power the bandgap reference circuits of FIGS. 2, 3, 4, 4*a* and 5 when the primary power source of these bandgap reference circuits has fallen below a predetermined voltage level is shown in addition to the primary power source. The secondary power source Vee may be Vcc like the primary power source, as shown in FIG. 7, or any other desired value. U.S. Pat. No. 4,451,742 issued May 29, 1984 to Aswell describes switching from a primary to a secondary power source and is herein incorporated by reference.

There are several advantages of the present invention over the prior art bandgap voltage circuit. A reduced number of bipolar junction transistors are used according to the present invention, and thus less area is used. Operation of the bandgap reference circuit is dependent on the ratios achieved through careful selection of the values of resistors R1 and R2, as well as the sizes of the transistors, and not on the absolute values of these components. The current mirror devices are scaled such that current going through the bipolar current legs is scaled. Also, multiple trip points can be set by multiplexing multiple taps on the divider. These multiple trip points are chosen to meet customer demands; typical values might be 5%, 10%, 20%, etc. of the value of VCC. Additionally, the present invention allows for VOUT to be brought to an output pin of the zero power SRAM and thus easily measured.

While the invention has been particularly shown and described with reference to preferred embodiments, it will be understood by those skilled in the art that various changes in form and detail may be made therein without departing from the spirit and scope of the invention.

What is claimed is:

1. A bandgap reference circuit, comprising:

a first supply voltage which provides a primary power source to the bandgap reference circuit;

a second supply voltage;

a plurality of bipolar junction transistors;

a *first* resistor, having a first terminal and a second terminal, with the first terminal of the *first* resistor connected to the first supply voltage and the second terminal of the *first* resistor *directly* connected to a base of [each] *at least two* bipolar junction transistors of the plurality of bipolar junction transistors;

a bandgap reference voltage is equal to the difference between the first supply voltage and a voltage present at an emitter of a first bipolar junction transistor of the plurality of bipolar junction transistors, wherein the first supply voltage provides the primary power source to the bandgap reference circuit so long as the [bandgap reference] *first supply* voltage does not fall below a predetermined voltage level; and a current mirror formed in part by a first transistor and a second transistor wherein the first transistor and the second transistor each have a first terminal, a second terminal, and a gate, wherein the first terminal of the first transistor and the first terminal of the second transistor are connected to the second supply voltage, and wherein the second terminal of the first transistor is coupled to a second bipolar junction transistor of the plurality of bipolar junction transistors, the second terminal of the second transistor is coupled to the *first* resistor, and the gate of the first transistor is coupled [is ]to the gate of the second transistor and the second terminal of the first transistor.

2. The bandgap reference circuit of claim 1, wherein the first transistor of the current mirror has a channel width and is coupled to a third transistor having a channel width, the second transistor of the current mirror has a channel width and is coupled to the third transistor, wherein the third transistor has a first terminal, a second terminal and a gate, and the first terminal of the third transistor is coupled to the second supply voltage, the second terminal of the third transistor is coupled to the emitter of the first bipolar junction transistor of the plurality of bipolar junction transistors, and the gate of the third transistor is coupled to the gate of the first transistor and the gate of the second transistor, wherein the third transistor is part of the current mirror; and wherein a current which flows through the second transistor is determined by the ratio of the channel width of the second transistor to the channel width of the first transistor and a current which flows through the first transistor, a current which flows through the third transistor is determined by the ratio of the channel width of the third transistor to the channel width of the first transistor and the current which flows through the first transistor, and the current which flows through the first transistor is determined in part by the ratio of the channel width of the third transistor to the channel width of the first transistor.

3. [The bandgap reference circuit of claim 2, further comprising:]*A bandgap reference circuit, comprising:*

*a first supply voltage which provides a primary power source to the bandgap reference circuit;*

*a second supply voltage;*

*a plurality of bipolar junction transistors;*

*a first resistor, having a first terminal and a second terminal, with the first terminal of the first resistor connected to the first supply voltage and the second terminal of the first resistor connected to a base of one or more bipolar junction transistors of the plurality of bipolar junction transistors;*

*a bandgap reference voltage is equal to the difference between the first supply voltage and a voltage present at an emitter of a first bipolar junction transistor of the plurality of bipolar junction transistors, wherein the first supply voltage provides the primary power source to the bandgap reference circuit so long as the first supply voltage does not fall below a predetermined voltage level;*

*a current mirror formed in part by a first transistor and a second transistor wherein the first transistor and the second transistor each have a first terminal, a second terminal, and a gate, wherein the first terminal of the first transistor and the first terminal of the second transistor are connected to the second supply voltage, and wherein the second terminal of the first transistor is coupled to a second bipolar junction transistor of the plurality of bipolar junction transistors, the second terminal of the second transistor is coupled to the first resistor, and the gate of the first transistor is coupled to the gate of the second transistor and the second terminal of the first transistor;* a plurality of bipolar current legs, with a first bipolar current leg having a collector of the second bipolar junction transistor of the plurality of bipolar junction transistors connected to the first supply voltage and an emitter of the second bipolar junction transistor connected to a first terminal of a second resistor, a second terminal of the second resistor coupled to the second terminal of the first transistor;

the second terminal of the *first* resistor connected to the second terminal of the second transistor of the current mirror; and a second bipolar current leg of the plurality of bipolar [is] current legs having a collector of the first bipolar junction transistor connected to the first supply voltage and the emitter of the first bipolar junction transistor connected to the second terminal of the third transistor, wherein the base of the first bipolar junction transistor *is* connected to the base of the second bipolar junction transistor and the second terminal of the *first* resistor[.],

*wherein the first transistor of the current mirror has a channel width and is coupled to a third transistor*

*having a channel width, the second transistor of the current mirror has a channel width and is coupled to the third transistor, wherein the third transistor has a first terminal, a second terminal and a gate, and the first terminal of the third transistor is coupled to the second supply voltage, the second terminal of the third transistor is coupled to the emitter of the first bipolar junction transistor of the plurality of bipolar junction transistors, and the gate of the third transistor is coupled to the gate of the first transistor and the gate of the second transistor, wherein the third transistor is part of the current mirror; and*

*wherein a current which flows through the second transistor is determined by the ratio of the channel width of the second transistor to the channel width of the first transistor and a current which flows through the first transistor, a current which flows through the third transistor is determined by the ratio of the channel width of the third transistor to the channel width of the first transistor and the current which flows through the first transistor, and the current which flows through the first transistor is determined in part by the ratio of the channel width of the third transistor to the channel width of the first transistor.*

4. The bandgap reference circuit of claim 3, wherein the emitter of the second bipolar junction transistor is a multiple emitter having M emitters, where M emitters is equal to the number of emitters of the multiple emitter.

5. The bandgap reference circuit of the claim 4, wherein the bandgap reference voltage is defined by the following equation:

$$[[VCC - VOUT]VOUT - VCC]VOUT - VCC = -Vbe - \frac{W2}{W3}\frac{kT}{q}\frac{R2}{R1}\ln\frac{MW1}{W3}$$

where Vbe is a base emitter voltage of the first bipolar junction transistor, k is Boltzman's constant, T is the temperature in degrees Kelvin, q is the electronic charge, M is the number of emitters of the second bipolar junction transistor, W1 is *the channel width of the third transistor, W2 is the channel width of the second transistor, W3 is the channel width of the first transistor, VCC is the first* supply voltage, VOUT–VCC is the bandgap reference voltage, R1 is the resistance of the second resistor and R2 is the resistance of the *first* resistor.

6. The bandgap reference circuit of claim 3, wherein the first supply voltage is a high voltage supply, the second supply voltage is a ground, and the first transistor, the second transistor, and the third transistor are each an n-channel transistor.

7. The bandgap reference circuit of claim 6, wherein the bandgap reference voltage is approximately 1.3 volts below VCC, where VCC is the first supply voltage.

8. The bandgap reference circuit of claim 3, wherein the first supply voltage is a ground, the second supply voltage is a high voltage supply, and the first transistor, the second transistor, and the third transistor are each a p-channel transistor.

9. The bandgap reference circuit of claim 8, wherein the bandgap reference voltage is approximately 2.5 volts.

10. The bandgap reference circuit of claim 1, wherein when the [bandgap reference] *first supply* voltage falls below the predetermined voltage level, a third supply voltage provides the primary power source to the bandgap reference circuit.

11. The bandgap reference circuit of claim 10, wherein the bandgap reference circuit is suitable for use in a zero power static random access memory (SRAM).

12. A bandgap reference circuit, comprising:

a first supply voltage which provides a primary power source to the bandgap reference circuit;

a second supply voltage;

a plurality of bipolar junction transistors;

a *first* resistor, having a first terminal and a second terminal, with the first terminal of the *first* resistor connected to the first supply voltage and the second terminal of the *first* resistor connected to a base of [each] *one or more* bipolar junction transistors of the plurality of bipolar junction transistors;

a bandgap reference voltage is equal to the difference between the first supply voltage and a voltage present at an emitter of a first bipolar junction transistor of the plurality of bipolar junction transistors, wherein the first supply voltage provides the primary power source to the bandgap reference circuit so long as the [bandgap reference] *first supply* voltage does not fall below a predetermined voltage level;

a current mirror formed in part by a first transistor and a second transistor wherein the first transistor and the second transistor each have a first terminal, a second terminal, and a gate, wherein the first terminal of the first transistor and the first terminal of the second transistor are connected to the second supply voltage, and wherein the second terminal of the first transistor is coupled to a second bipolar junction transistor of the plurality of bipolar junction transistors, the second terminal of the second transistor is coupled to the *first* resistor, and the gate of the first transistor is coupled to the gate of the second transistor and the second terminal of the first transistor;

a plurality of bipolar current legs, with a first bipolar current leg having a collector of the second bipolar junction transistor of the plurality of bipolar junction transistors connected to the first supply voltage and an emitter of the second bipolar junction transistor connected to a first terminal of a second resistor, a second terminal of the second resistor coupled to the second terminal of the first transistor;

the second terminal of the *first* resistor connected to the second terminal of the second transistor of the current mirror;

a second bipolar current leg of the plurality of bipolar current legs having a collector of the first bipolar junction transistor of the plurality of bipolar junction transistors connected to the first supply voltage and the emitter of the first bipolar junction transistor connected to a second terminal of a third transistor which is part of the current mirror, wherein the base of the first bipolar junction transistor is connected to the base of the second bipolar junction transistor and the second terminal of the *first* resistor, [and] a gate of the third transistor *is* connected to the gate of the second transistor, and a first terminal of the third transistor is connected to the second supply voltage; and wherein the first transistor of the current mirror has a channel width and is coupled to the third transistor having a channel width, the second transistor of the current mirror has a channel width and is coupled to the third transistor, wherein a current which flows through the second transistor is determined by the ratio of the channel width of the second transistor to the channel width of the first transistor and a current which flows through the first transistor, a current which flows through the third transistor is determined by the ratio of the channel width of the third transistor to the channel width of the first transistor and the current which flows through the first transistor, and the current which flows through the first transistor is determined in part by the ratio of the channel width of the third transistor to the channel width of the first transistor.

13. The bandgap reference circuit of claim 12, wherein the emitter of the second bipolar junction transistor is a multiple emitter having M emitters, where M emitters is equal to the number of emitters of the multiple emitter.

14. The bandgap reference circuit of claim 13, wherein the bandgap reference voltage is defined by the following equation:

$$\left[[VCC - VOUT]VOUT - VCC = -Vbe - \frac{W2}{W3}\frac{kT}{q}\frac{R2}{R1}\ln\frac{MW1}{W3}\right]$$

$$VOUT - VCC = -Vbe - \frac{W2}{W3}\frac{kT}{q}\frac{R2}{R1}\ln\frac{MW1}{W3}$$

where Vbe is a base emitter voltage of the first bipolar junction transistor, k is Boltzman's constant, T is the temperature in degrees Kelvin, q is the electronic charge, M is the number of emitters of the second bipolar junction transistor, W1 is the channel width of the third transistor, W2 is the channel width of the second transistor, W3 is the channel width of the first transistor, VCC is the first supply voltage, VOUT–VCC is the bandgap reference voltage, R1 is the resistance of the second resistor and R2 is the resistance of the *first* resistor.

15. The bandgap reference circuit of claim 12, wherein the first supply voltage is a high voltage supply, the second supply voltage is a ground, and the first transistor, the second transistor, and the third transistor are each an n-channel transistor.

16. The bandgap reference circuit of claim 15, wherein the bandgap reference voltage is approximately 1.3 volts below VCC, where VCC is the first supply voltage.

17. The bandgap reference circuit of claim 12, wherein the first supply voltage is a ground, the second supply voltage is a high voltage supply, and the first transistor, the second transistor, and the third transistor are each a p-channel transistor.

18. The bandgap reference circuit of claim 17, wherein the bandgap reference voltage is approximately 2.5 volts.

19. The bandgap reference circuit of claim 12, wherein when the [bandgap reference] *first supply* voltage falls below the predetermined voltage level, a third supply voltage provides the primary power source to the bandgap reference circuit.

20. The bandgap reference circuit of claim 19, wherein the bandgap reference circuit is suitable for use in a zero power static random access memory (SRAM).

* * * * *